(12) United States Patent
Morinaga et al.

(10) Patent No.: US 6,806,626 B2
(45) Date of Patent: Oct. 19, 2004

(54) ELECTRONIC COMPONENT

(75) Inventors: Shungo Morinaga, Uozu (JP); Ryuhei Yoshida, Toyama (JP); Hideaki Kuroda, Toyama-ken (JP)

(73) Assignee: Murata Manufacturing Co., LLP, Kyoto (JP)

( * ) Notice: Subject to any disclaimer, the term of this patent is extended or adjusted under 35 U.S.C. 154(b) by 0 days.

(21) Appl. No.: 09/971,034

(22) Filed: Oct. 5, 2001

(65) Prior Publication Data
US 2002/0084724 A1 Jul. 4, 2002

(30) Foreign Application Priority Data
Nov. 7, 2000 (JP) ......................................... 2000-339232

(51) Int. Cl.[7] .............................................. H01L 41/08
(52) U.S. Cl. ...................... 310/366; 310/365; 310/328; 310/320
(58) Field of Search ................................ 310/366, 358, 310/320, 328, 365

(56) References Cited

U.S. PATENT DOCUMENTS

| | | | | |
|---|---|---|---|---|
| 2,479,926 A | * | 8/1949 | Gravley | 310/332 |
| 4,805,057 A | * | 2/1989 | Ogawa et al. | 360/292 |
| 5,121,024 A | * | 6/1992 | Seto | 310/320 |
| 5,153,477 A | * | 10/1992 | Jomura et al. | 310/328 |
| 5,481,154 A | * | 1/1996 | Kaida | 310/368 |
| 6,064,142 A | | 5/2000 | Yamamoto | |
| 6,215,230 B1 | * | 4/2001 | Ide et al. | 310/366 |
| 6,608,428 B2 | * | 8/2003 | Nishimura et al. | 310/366 |

FOREIGN PATENT DOCUMENTS

| | | |
|---|---|---|
| EP | 1 037 383 A2 | 9/2000 |
| JP | 60-066882 | 4/1985 |
| JP | 60-074709 | 4/1985 |
| JP | 3-165613 | 7/1991 |
| JP | 5-083079 | 4/1993 |
| JP | 08-237066 A | 9/1996 |
| JP | 08-237066 | 9/1996 |
| JP | 2000-269774 | 9/2000 |

* cited by examiner

*Primary Examiner*—Mark Budd
(74) *Attorney, Agent, or Firm*—Keating & Bennett, LLP

(57) ABSTRACT

In a piezoelectric resonator, first and second resonance electrodes are provided on the upper surface and the lower surface of a piezoelectric member, inner electrode layers for leading the first and second resonance electrodes to the upper and lower surfaces are provided and extend to the upper and lower surfaces of the piezoelectric member, and connecting electrodes are provided on the upper and lower surfaces of the piezoelectric member, and are electrically connected to the corresponding resonance electrodes via the inner electrode layers.

20 Claims, 12 Drawing Sheets

ELECTRONIC COMPONENT

BACKGROUND OF THE INVENTION

1. Field of the Invention

The present invention relates to an electronic component such as a piezoelectric resonator, and more particularly, to an electronic component in which an inner electrode for connection to electrodes provided on a pair of surfaces of the electronic component is provided in a member of the electronic component such as a piezoelectric member.

2. Description of the Related Art

Conventionally, in the production of oscillators and other similar devices, piezoelectric resonators utilizing a thickness shear vibration mode have often been used. In energy-trap type piezoelectric resonators utilizing a thickness shear vibration mode, resonance electrodes are provided on both main surfaces of an elongated rectangular piezoelectric plate. In such piezoelectric resonators, a resonance electrode provided on one main surface thereof is electrically connected to a connecting electrode which extends over an end surface of the piezoelectric plate, reaching the bottom surface so that surface-mounting is easily performed via one of the main surfaces. In some cases, the corners of the connecting electrode are scraped when the piezoelectric resonator is processed. Japanese Unexamined Patent Application Publication No. 8-237066 discloses a piezoelectric resonator, which is shown in the perspective view of FIG. 15, which improves the reliability of connecting electrodes provided on the front and back surfaces.

In a piezoelectric resonator 101, resonance electrodes 103 and 104 are arranged so as to oppose each other at the center of an elongated piezoelectric plate 102 disposed therebetween.

Moreover, end-surface electrodes 105 and 106 are provided on the end surfaces 102a and 102b of the piezoelectric plate 102, respectively. The end-surface electrodes 105 and 106 are electrically connected to the resonance electrodes 103 and 104, respectively. Moreover, protective films 107 and 108 are arranged to cover and protect the end-surface electrodes 105 and 106, respectively. The resonance electrodes 103 and 104 are arranged on the main surfaces of the piezoelectric plate 102 to extend over the protective films 107 and 108, respectively.

Connecting electrodes 109 and 110 are provided on the upper and lower surfaces of the piezoelectric plate 102, and are electrically connected to the end-surface electrodes 106 and 105, respectively. Moreover, as shown in FIG. 15, the connecting electrodes 109 and 110 are provided on the upper and lower surfaces of the piezoelectric plate 102 and also on the upper and lower surfaces of the protective films 107 and 108, respectively.

In the piezoelectric resonator 101, the protective films 107 and 108 cover the end-surface electrodes 105 and 106, respectively. This improves the reliability of the electrical connection between the resonance electrode 103 and the connecting electrode 110 and between the resonance electrode 104 and the connecting electrode 109.

Referring to the manufacture of the piezoelectric resonator 101, electrodes (referred to as completely coated electrodes), which will be formed to define the end-surface electrodes, are disposed on the entire areas of the main surfaces of a piezoelectric block 111 shown in FIG. 16, and the piezoelectric block 111 is polarized in the thickness direction. After the polarization, protective films 112 and 113 are provided on the completely coated electrodes (not shown), respectively. The first mother piezoelectric block 111 manufactured as described above is cut along the dashed lines A in FIG. 16. Thus, the second mother piezoelectric block 114 shown in FIG. 17 is obtained. After this, a mother resonance electrode 115 and a mother connecting electrode 116, are provided on the piezoelectric block 114. Subsequently, the piezoelectric block 114 is cut along the dashed lines B to obtain the piezoelectric resonator 101.

In an energy-trap type piezoelectric resonator utilizing a thickness shear vibration mode, undesirable spurious responses are produced, depending on the size in the longitudinal direction of the piezoelectric plate 102. These undesirable spurious responses increase when the size of the piezoelectric resonator is reduced. The length of the piezoelectric plate 102 must be adjusted so that spurious responses, which are due to the length of the piezoelectric plate 102, are suppressed.

The size in the longitudinal direction of the piezoelectric resonator 101 is determined primarily by the thickness of the piezoelectric block 111 as seen in the above-described method of producing the piezoelectric resonator 101. Accordingly, when the longitudinal size of the piezoelectric plate 102 is changed to suppress the spurious responses, the thickness of the piezoelectric block 111 must also be changed. Thus, the adjustment of the length of the piezoelectric plate 102 is very difficult to perform.

SUMMARY OF THE INVENTION

To overcome the above-described problems, preferred embodiments of the present invention provide an electronic component in which the reliability of electrical connection of an electrode provided on the upper surface of a member of the electronic component, such as a piezoelectric member, to an electrode provided on the lower surface of the member is greatly improved. Moreover, the size of the member of the electronic component is easily adjusted while eliminating the problems experienced with the conventional techniques described above.

Preferred embodiments of the present invention provide an energy-trap type piezoelectric resonator in which surface mounting is easily performed onto a mother board at least from one main surface of the resonator, the reliability of the electrical connection between the electrodes provided on the main surfaces is very high, the longitudinal size of the piezoelectric member is easily adjusted, and therefore, undesirable spurious responses are easily eliminated when the size of the resonator is reduced.

According to a preferred embodiment of the present invention, an electronic component includes a member having upper and lower surfaces opposed to each other, a pair of side surfaces opposed to each other, and a pair of end surfaces opposed to each other, the pair of side surfaces extend in the longitudinal direction of the member and are opposed to each other in the width direction of the member, a first electrode provided on the upper surface of the member of the electronic component, a flat plate-shaped first inner electrode layer film which is exposed at the upper surface of the member of the electronic component at a desired region in the width direction so as to be electrically connected to the first electrode, said first inner electrode layer extending from the upper surface to the lower surface, and the first inner electrode layer being exposed at the lower surface at a desired region in the width direction, and a connecting electrode provided on the lower surface of the member of the electronic component and electrically connected to the first inner electrode film.

Preferably, the electronic component further includes a second inner electrode layer arranged opposite to the first inner electrode layer via a layer of the member of the electronic component.

Also, preferably, the first inner electrode film extends in a direction that is substantially perpendicular to the upper surface of the member of the electronic component.

At least one of the first inner electrode layer and the second inner electrode layer is preferably arranged to intersect the upper surface at an angle of less than about 90°.

According to another preferred embodiment of the present invention, a energy-trap type piezoelectric resonator includes a piezoelectric body having an upper surface, a lower surface, a pair of side surfaces opposed to each other, and a pair of first and second end surfaces opposed to each other, the pair of side surfaces extending in the longitudinal direction of the piezoelectric member and opposing each other in the width direction of the piezoelectric member, first and second resonance electrodes provided on the upper and lower surfaces of the piezoelectric member, respectively, the first resonance electrode extending from an edge defined by the first end surface and the upper surface toward the second end surface, the second resonance electrode extending from an edge defined by the second end surface and the lower surface toward the first end surface, the first and second resonance electrodes being arranged to overlap at the approximate center of the piezoelectric member in the longitudinal direction, a flat plate-shaped inner electrode layer which is exposed at the upper surface in at a desired region in the width direction of the piezoelectric member, the inner electrode layer extending from the upper surface toward the lower surface, the inner electrode layer being exposed at the lower surface at a desired region in the width direction of the piezoelectric member, and electrically connected to the first or second resonance electrode, and a connecting electrode provided on the upper or lower surface of the piezoelectric member and electrically connected to the inner electrode layer.

Preferably, the inner electrode layer includes a first inner electrode layer connected to the first resonance electrode and a second inner electrode layer electrically connected to the second resonance electrode.

Also, preferably, the inner electrode layer is exposed at each of the upper and lower surfaces of the piezoelectric member over the entire width thereof.

The inner electrode layer is preferably exposed at the lower surface of the piezoelectric member over a portion of the width thereof.

Preferably, the inner electrode layer extends in a direction that is substantially perpendicular to the upper and lower surfaces.

The inner electrode layer is preferably arranged to intersect the upper surface of the piezoelectric member at an angle of less than about 90°.

Preferably, the piezoelectric resonator in accordance with another preferred embodiment of the present invention includes a charge-output inner electrode layer defining a capacitor and arranged to allow for output or taking out of the electric charge from the capacitor is arranged to oppose to the inner electrode layer with a layer of the piezoelectric member therebetween.

Other features, elements, characteristics and advantages of the present invention will become more apparent from the detailed description of preferred embodiments below with reference to the attached drawings.

DETAILED DESCRIPTION OF PREFERRED EMBODIMENTS

Hereinafter, the present invention will become more apparent from the following description of the preferred embodiments according to the present invention made with reference to the drawings.

Figure 1A:
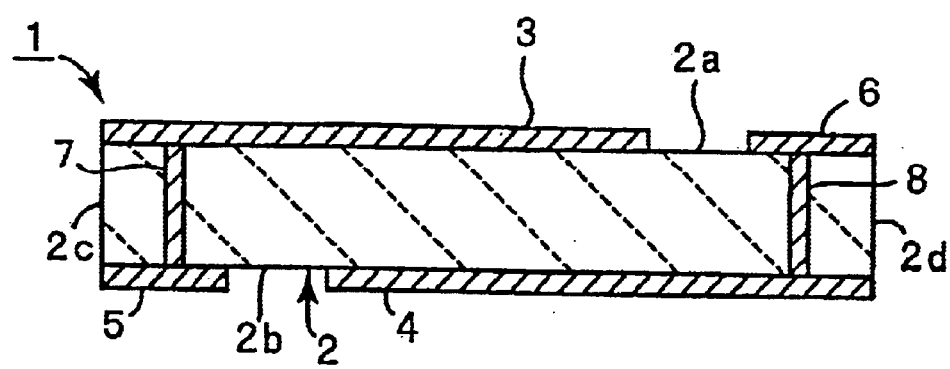
FIG. 1A is a longitudinal cross-sectional view of an electronic component according to a first preferred embodiment of the present invention.

FIG. 1A is a longitudinal cross-sectional view of an energy-trap type piezoelectric resonator according to a first preferred embodiment of the present invention.

Figure 1B:
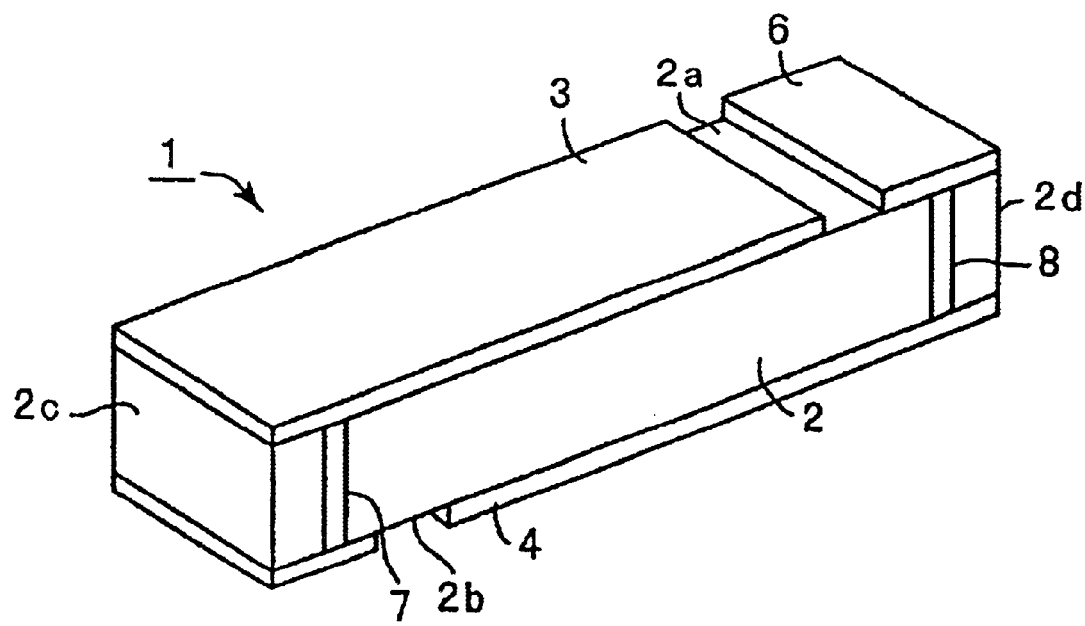
FIG. 1B is a perspective view showing the appearance of the electronic component.

FIG. 1B is a perspective view of the energy-trap type piezoelectric resonator.

A piezoelectric resonator 1 includes a piezoelectric member 2 having an elongated, substantially rectangular plate shape. A first resonance electrode 3 is provided on the upper surface 2a of the piezoelectric member 2. A second resonance electrode 4 is provided on the lower surface 2b. The resonance electrode 3 extends from the edge defined by an end surface 2c and the upper surface 2a of the piezoelectric member 2 toward the center of the piezoelectric member 2. On the other hand, the resonance electrode 4 extends from the edge defined by an end surface 2d and the lower surface 2b toward the center of the piezoelectric member 2. The resonance electrodes 3 and 4 are arranged on the front and back side surfaces of the piezoelectric member 2 and are opposed to each other via the piezoelectric member 2 in the approximate center area thereof.

The piezoelectric member 2 is polarized in the direction extending from the end surface 2c toward the end surface 2d. Thus, the portion in which the resonance electrodes 3 and 4 are opposed to each other with the piezoelectric member 2 therebetween defines a resonance portion utilizing an energy-trap type thickness shear vibration mode.

A connecting electrode 5 is arranged to extend from the end surface 2c on the lower surface 2b of the piezoelectric member 2. Similarly, a connecting electrode 6 is arranged to extend from the end surface 2d on the upper surface 2a of the piezoelectric member 2. In this preferred embodiment, the connecting electrodes 5 and 6 are arranged to extend along the edge defined by the end surface 2c and the lower surface 2b and the edge defined by the end surface 2d and the upper surface 2a, respectively. The connecting electrodes 5 and 6 may also be arranged to be separated from the end surfaces 2c and 2d.

An inner electrode layer 7 for electrically connecting the resonance electrode 3 to the connecting electrode 5, and an inner electrode layer 8 for electrically connecting the resonance electrode 4 to the connecting electrode 6 are provided inside the piezoelectric member 2. Accordingly, the piezoelectric resonator 1 can be surface-mounted onto a mother board via one of the upper surface 2a and the lower surface 2b.

Figure 15:
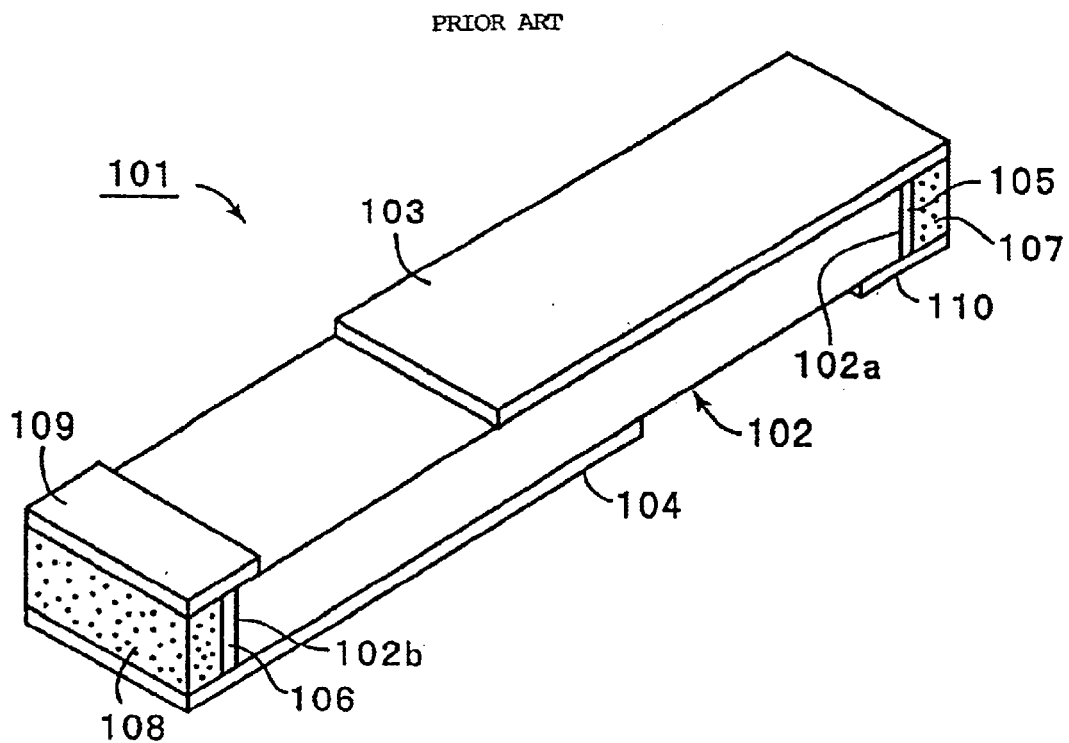
FIG. 15 is a perspective view of an example of a conventional piezoelectric resonator.
Figure 16:
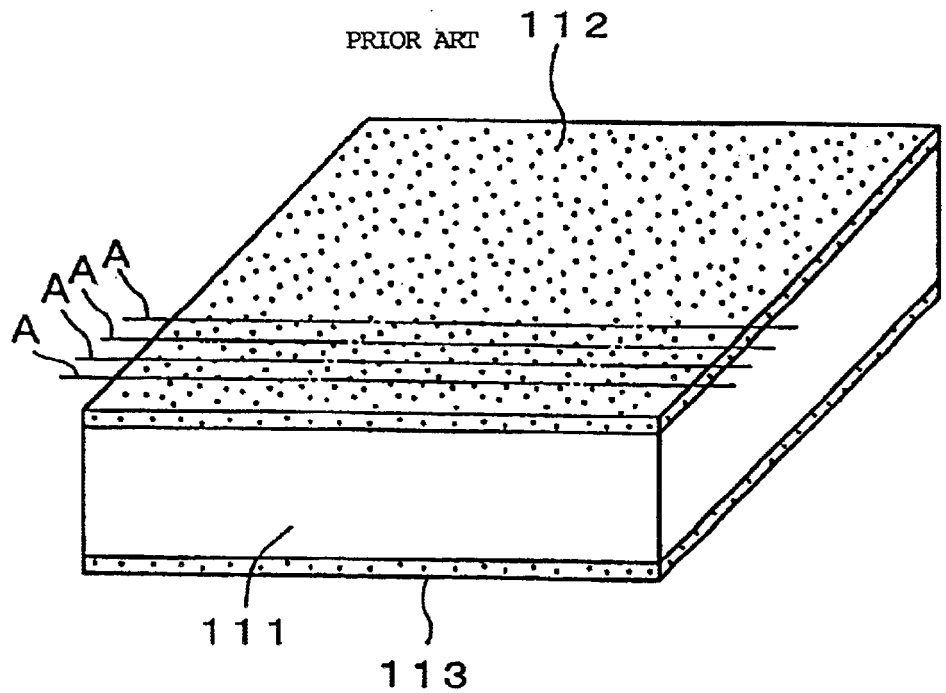
FIG. 16 is a perspective view of the first mother piezoelectric block used to obtain the conventional piezoelectric resonator.
Figure 17:
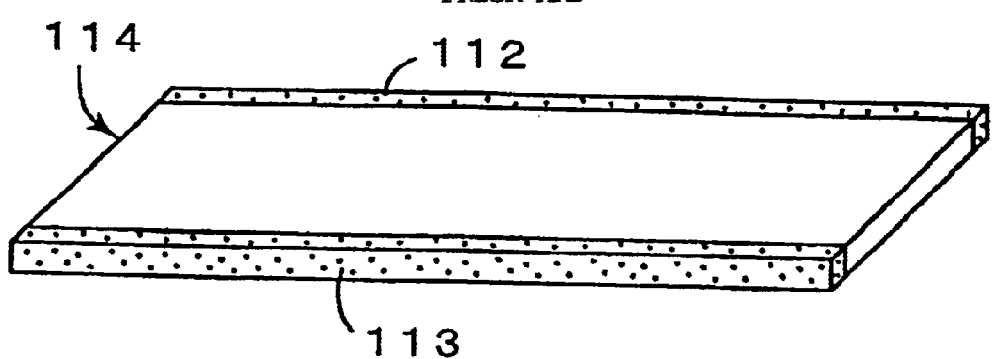
FIG. 17 is a perspective view of the second mother piezoelectric block obtained by cutting the piezoelectric block shown in FIG. 16.
Figure 18:
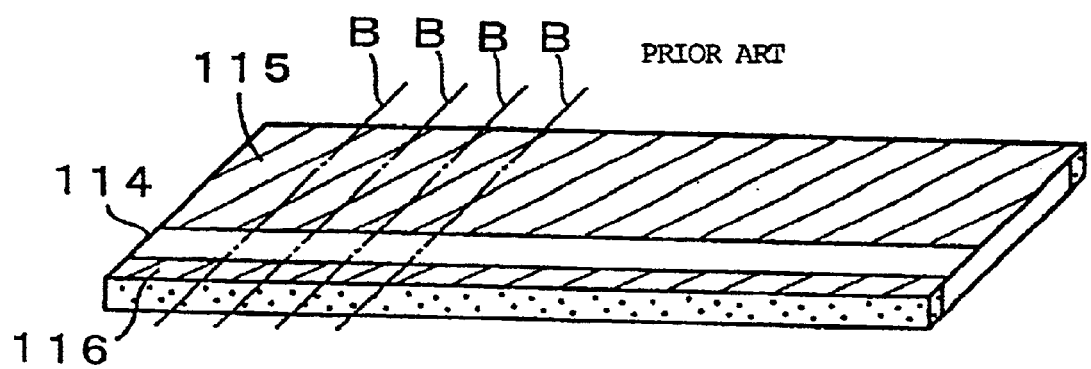
FIG. 18 is a perspective view showing the state in which a mother resonance electrode is formed on the second mother piezoelectric block shown in FIG. 17.

Moreover, the surfaces of the inner electrode layers 7 and 8 that are near the end surfaces 2c and 2d are not exposed. Thus, the reliability of the electrical connection of the upper and lower electrodes, that is, the reliability of the electrical connection between the resonance electrode 3 and the connecting electrode 5 and between the resonance electrode 4 and the connecting electrode 6 is greatly improved, similarly to the piezoelectric resonator 101 shown in FIG. 15.

In the piezoelectric resonator 1 of this preferred embodiment, the size in the longitudinal direction of the piezoelectric member 2, that is, the size in the direction between the end surfaces 2c and 2d is easily adjusted. Accordingly, adjustment of the length of the piezoelectric member 2 is easily performed to minimize undesirable spurious responses, which are caused due to the length of the piezoelectric member 2. Thus, a compact piezoelectric resonator having excellent characteristics is easily provided.

Hereinafter, a method of producing the piezoelectric resonator 1 will be described with reference to FIGS. 2 to 5.

Figure 2:
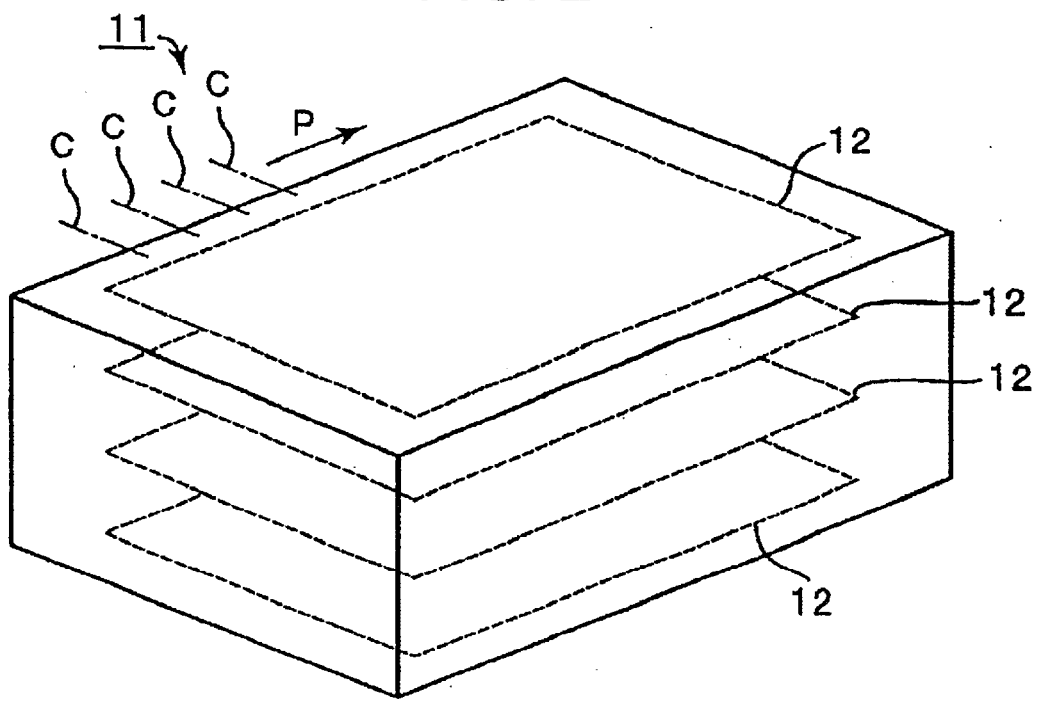
FIG. 2 is a perspective view of the first mother piezoelectric block prepared to produce the electronic component of the first preferred embodiment of the present invention.

First, a mother piezoelectric block 11 is prepared as shown in the perspective view of FIG. 2. The piezoelectric block 11 is polarized in a direction indicated by arrow P in FIG. 2. Piezoelectric ceramics such as lead titanate type ceramics, lead titanate zirconate type ceramics, or other suitable piezoelectric ceramics are preferably used as the piezoelectric material to form the piezoelectric block 11.

A plurality of mother inner electrode layers 12, shown by the broken lines, are arranged to overlap each other with piezoelectric layers therebetween. The inner electrode layers 12, together with the piezoelectric block 11, are obtained by a known ceramic-metal combined firing technique. That is, piezoelectric ceramic green sheets and the plurality of inner electrode layers 12 are laminated and integrally fired to obtain the piezoelectric block 11.

Figure 3:
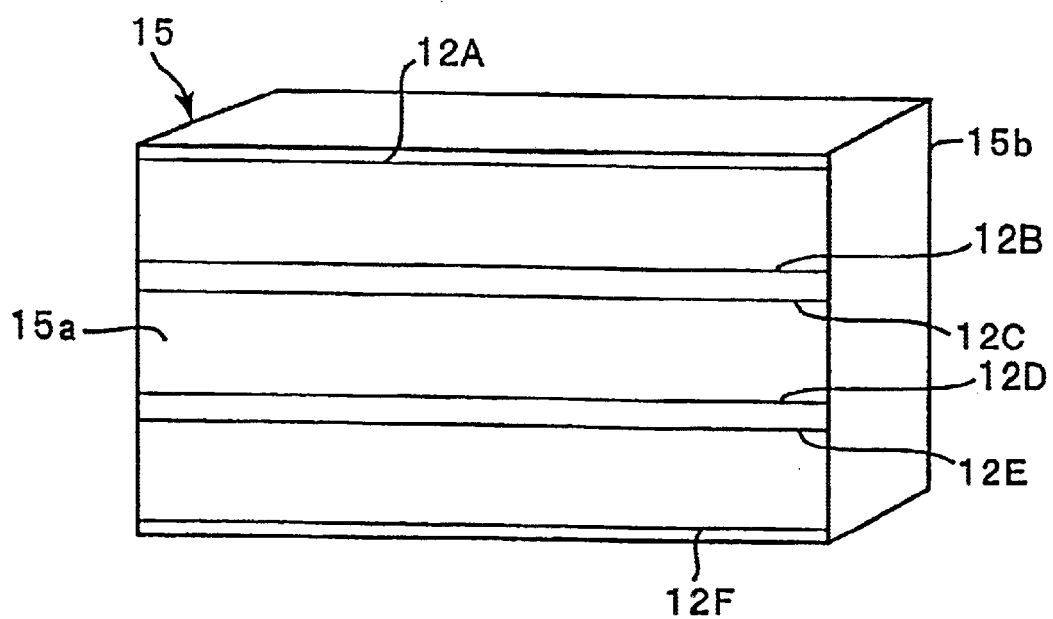
FIG. 3 is a perspective view of the second mother piezoelectric block obtained by cutting the first mother piezoelectric block shown in FIG. 2.
Figure 4:
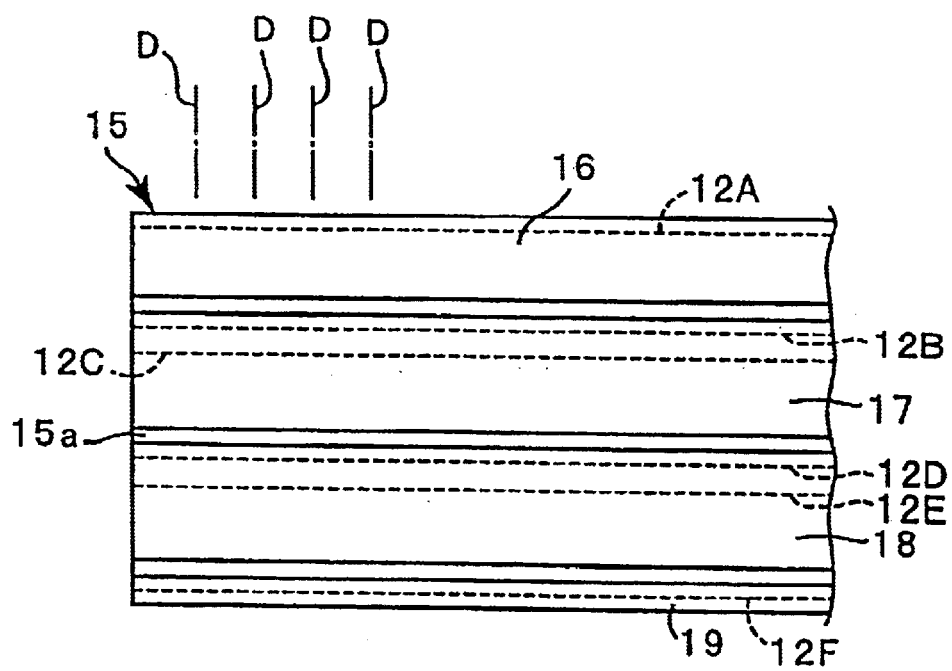
FIG. 4 is a partially cutaway front view showing the state in which a mother resonance electrode is provided on the second mother piezoelectric block.

In FIG. 2, the number of the plurality of inner electrode layers 12 is reduced compared to that in FIG. 3 and FIG. 4 for simple illustration.

Next, the piezoelectric block 11 is cut along the dashed lines C. In this way, a piezoelectric block 15 shown in FIG. 3 is obtained as a second mother piezoelectric block. The plurality of inner electrode layers 12A to 12F of the second mother piezoelectric block 15 are exposed at side surfaces 15a and 15b which are formed by cutting, as described above.

Next, substantially rectangular strip-shaped mother electrodes 16 to 19 are provided on the side surface 15a of the piezoelectric member 15, as shown in FIG. 4. The electrodes 16 to 18 are arranged to be electrically connected corresponding to the predetermined inner electrode layers. For example, the electrode 17 is arranged such that one side edge 17a thereof is positioned outside the inner electrode layers 12B and 12C, and moreover, the other side edge 17b thereof does not reach the inner electrode layer 12D.

Figure 5:
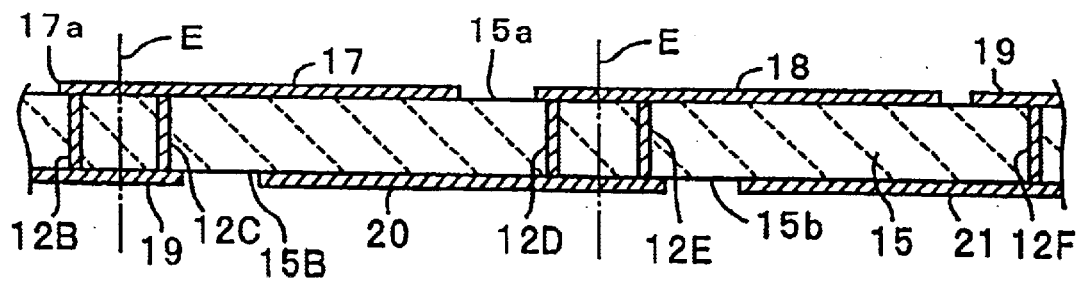
FIG. 5 is a partially cutaway cross-sectional view showing the portion of the second mother piezoelectric block taken along a dashed line D in FIG. 4.

Similarly, a plurality of mother electrodes 19 to 21 are disposed on the side surface 15b of the piezoelectric block 15, as shown in the cross-sectional view of FIG. 5.

Next, the piezoelectric block 15 is cut along the dashed lines D shown in FIG. 4. Moreover, the piezoelectric block 15 is cut along the dashed lines E shown in FIG. 5 to produce the piezoelectric resonator 1 shown in FIG. 1.

As seen in the above-described method of producing the piezoelectric resonator 1, adjustment of the length of the piezoelectric member 2, if it is desired in production of the piezoelectric resonator 1, is easily performed by changing the cutting position indicated by the dashed lines E shown in FIG. 5. Accordingly, generation of undesirable spurious responses, due to the length of the piezoelectric resonator, is prevented by shifting the frequencies at which the spurious responses occur.

Figure 6A:
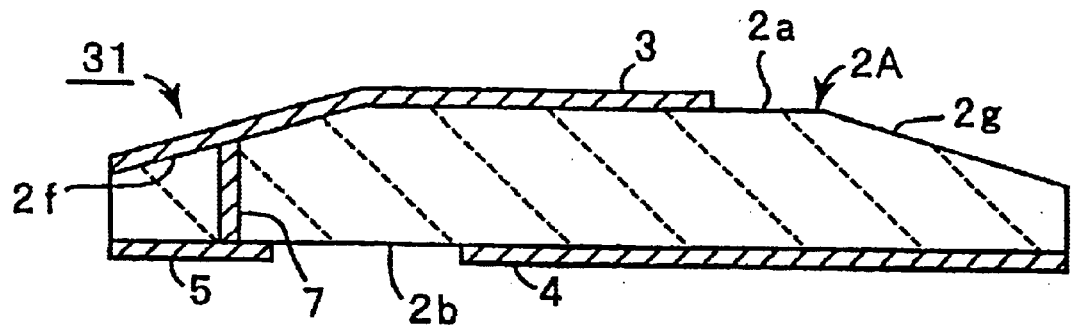
FIGS. 6A to 6C are longitudinal cross-sectional views showing modifications of the piezoelectric resonator according to the first preferred embodiment of the present invention.

For the piezoelectric resonator 1 shown in FIG. 1, the piezoelectric member 2 having an elongated rectangular-plate shape is preferably used. However, the member of the electronic component and the piezoelectric member according to various preferred embodiments of the present invention are not limited to the above-described elongated rectangular-plate shape. For example, a piezoelectric member 2A that is beveled to have inclined surfaces 2f and 2g at both end potions of the upper surface, as shown in FIG. 6A, may be used. In this case, the resonance electrode 3 provided on the upper surface 2a is electrically connected to the connecting electrode 5 via the inner electrode layer 7, similarly to the first preferred embodiment. The piezoelectric resonator 31 can be surface-mounted via the lower surface 2b, since the upper surface 2a is beveled. Thus, no connecting electrode is provided on the upper surface 2a, and moreover, no inner electrode, which is electrically connected to the resonance electrode, is provided.

Figure 6B:
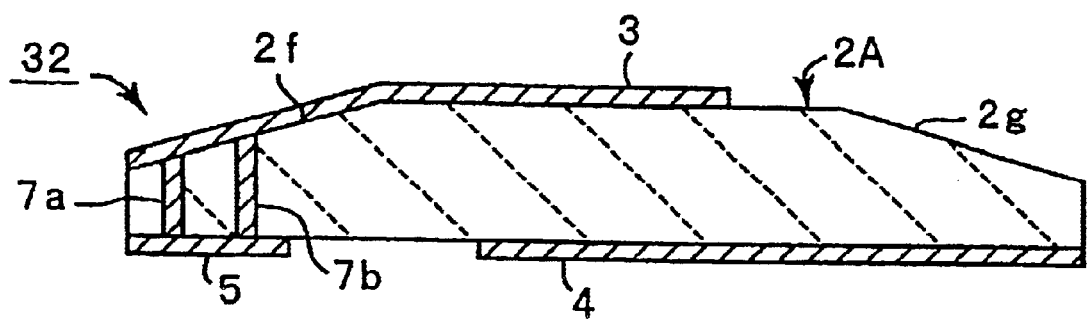

To further improve the reliability of electrical connection in a piezoelectric resonator 32 using a beveled piezoelectric member 2A, a plurality of inner electrode layers 7a and 7b are provided, as shown in FIG. 6B. In this case, electrical connection of the connecting electrode 5 to the resonance electrode 3 is achieved by the plurality of inner electrode layers 7a and 7b.

Figure 6C:
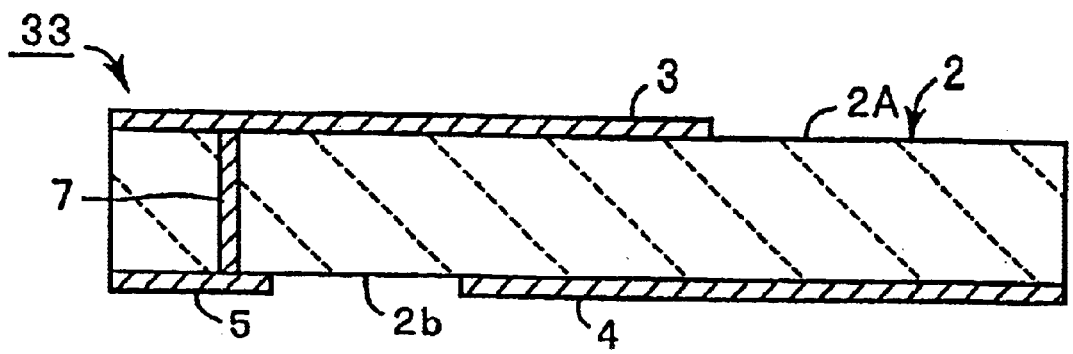

In the first preferred embodiment, the inner electrode layers 7 and 8 are arranged to be connected to the resonance electrodes 3 and 4 such that surface mounting can be easily performed from the upper surface 2a side or the lower surface 2b. It is possible that only the inner electrode film 7 is provided, as shown in FIG. 6C. In this case, the connecting electrode 5 is provided on the lower surface 2b of the piezoelectric member 2. The piezoelectric resonator 33 can be surface-mounted via the lower surface 2b.

Figure 7:
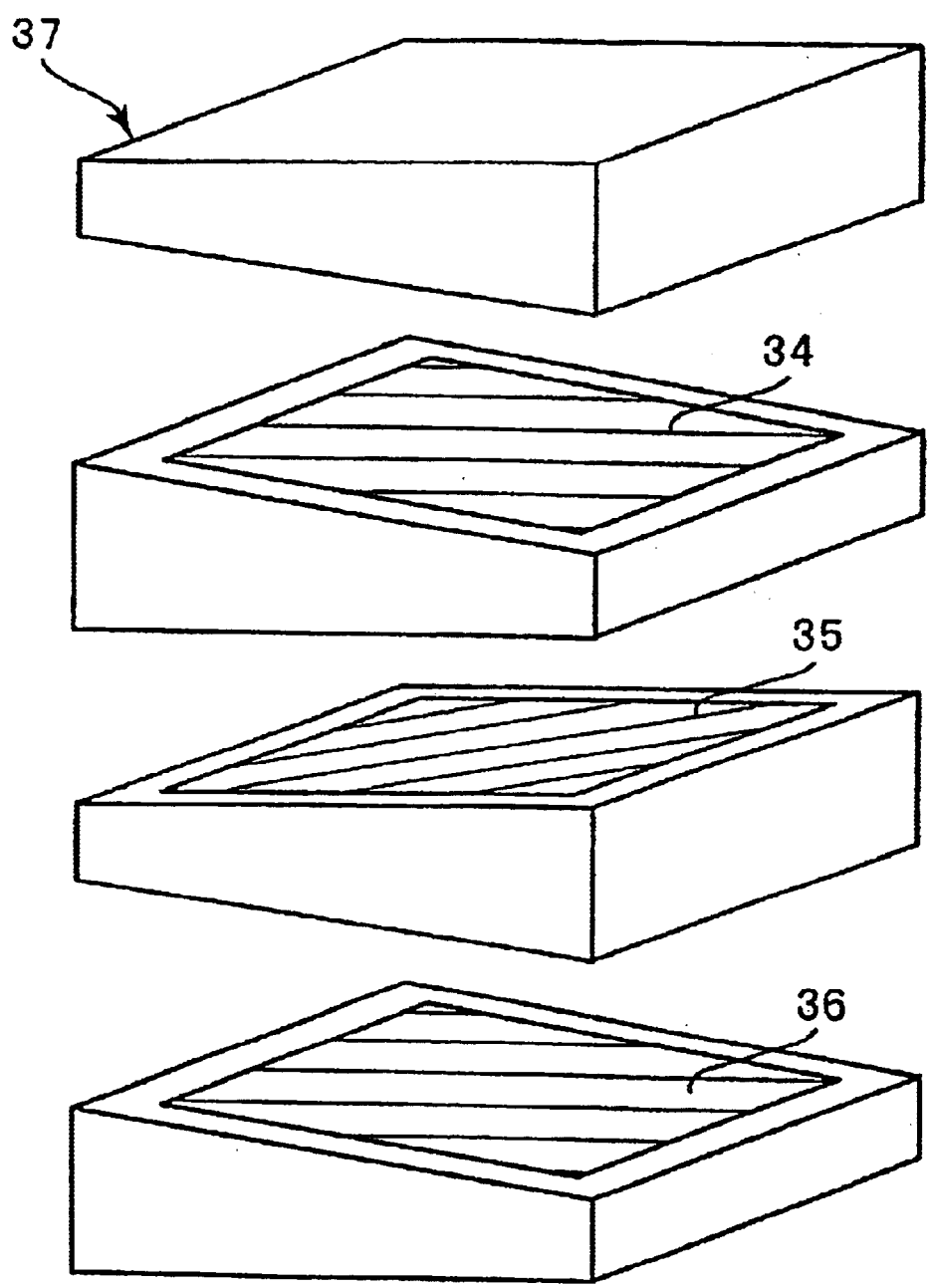
FIG. 7 is an exploded perspective view of a piezoelectric block for use in obtaining a modification of the piezoelectric resonator of the first preferred embodiment of the present invention.
Figure 8:
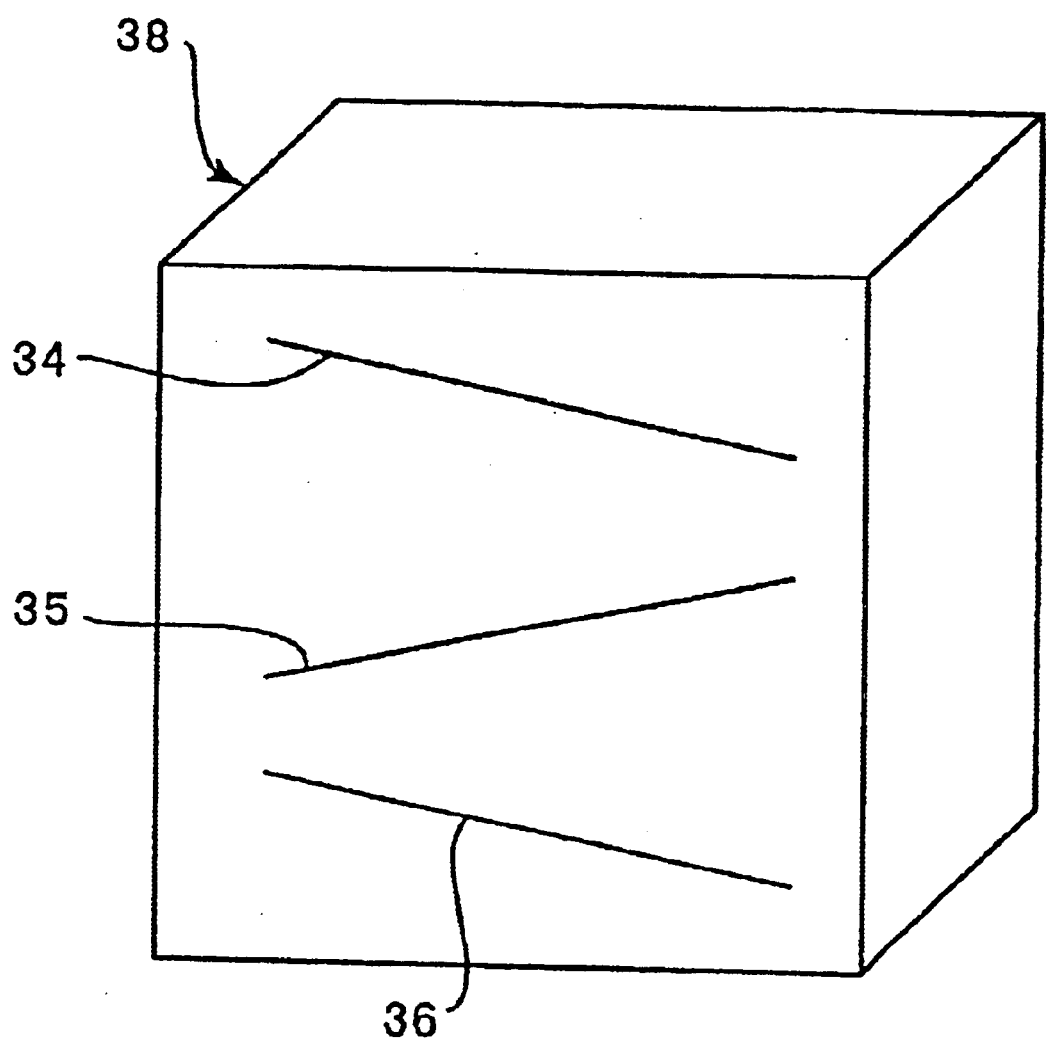
FIG. 8 is a perspective view showing a mother piezoelectric block obtained by cutting the piezoelectric block shown in FIG. 7.

Moreover, in the first preferred embodiment, the plurality of inner electrode films 12 are preferably arranged to be substantially parallel to each other inside the mother piezoelectric block 11, as shown in FIG. 2. Alternatively, a plurality of inner electrode layers 34 to 36 may be arranged to be inclined in a mother piezoelectric block 37 having a block shape as shown in the exploded perspective view of FIG. 7. The mother piezoelectric block 37 including the plurality of inner electrode layers 34 to 36 inclined as described above is cut substantially parallel to a side surface 37a in the vertical direction, whereby a second mother piezoelectric block 38 shown in FIG. 8 is obtained.

Figure 9A:
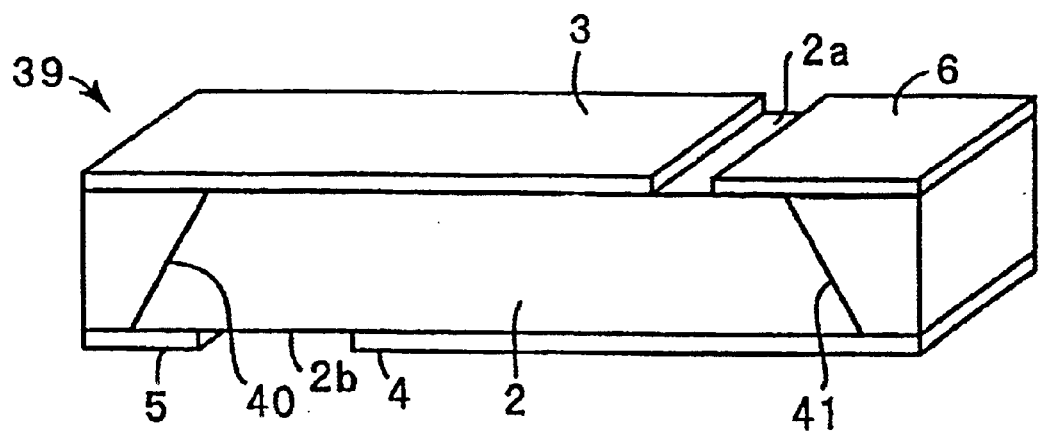
FIG. 9A is a perspective view showing a modification of the piezoelectric resonator of the first preferred embodiment of the present invention.

An energy-trap type piezoelectric resonator 39 shown in FIG. 9A is obtained by using the second mother piezoelectric block 38 instead of the second piezoelectric block 15 shown in FIG. 3, and subjecting the piezoelectric block 38 to processing similar to that described in the first preferred embodiment. That is, since the plurality of inner electrode layers 35 to 37 are inclined in the mother piezoelectric block 37, a structure in which inner electrode layers 40 and 41 are inclined with respect to the upper surface 2a and the lower surface 2b is produced in the final piezoelectric resonator 39.

Thus, according to the present invention, the inner electrode layers do not have to be substantially perpendicular to the upper surface 2a and the lower surface 2b, provided that the inner electrode layers extend from the upper surface 2a, as the first main surface, to the lower surface 2b, as the second main surface, similarly to the inner electrode layers 40 and 41.

Figure 9B:
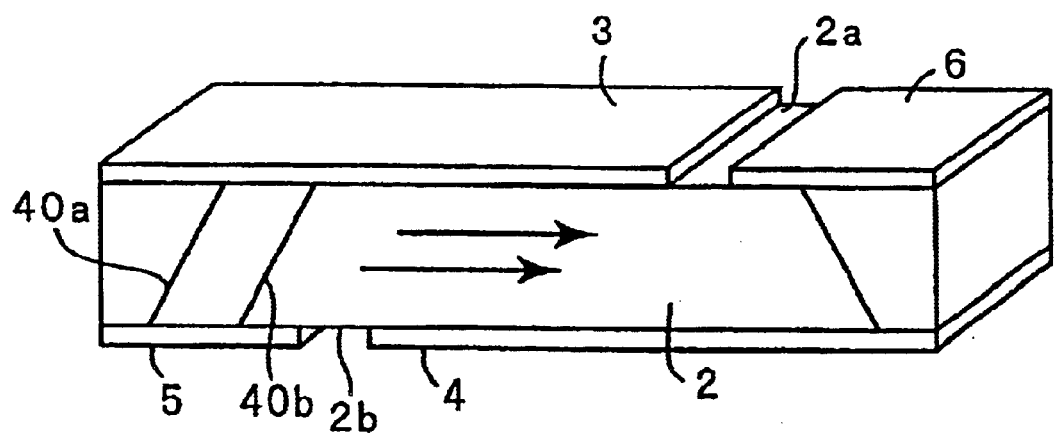
FIG. 9B is a perspective view of another modification of the piezoelectric resonator of the first preferred embodiment of the present invention.

Moreover, as shown in FIG. 9B, a plurality of inner electrode layers 40a and 40b are arranged to be inclined inner electrode layers such that the reliability of the electrical connection between the resonance electrode 3 on the upper surface and the connecting electrode 5 on the lower surface is further improved.

Figure 10A:
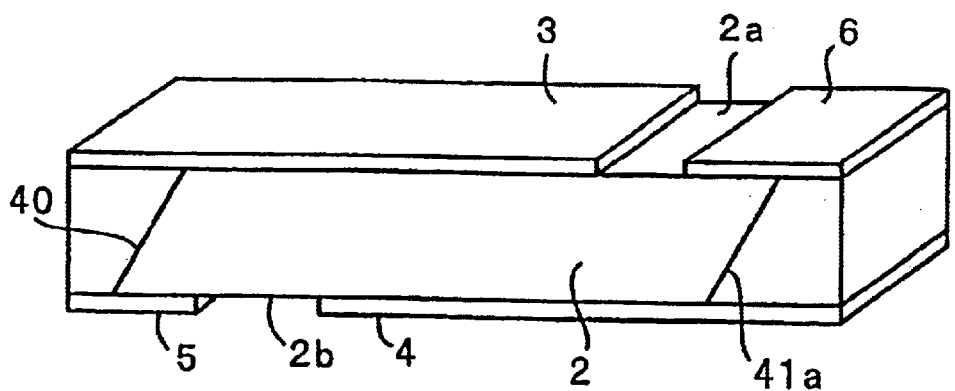
FIG. 10A is a perspective view of yet another modification of the piezoelectric resonator of the first preferred embodiment of the present invention.

Moreover, in FIG. 9A, the inner electrode layers 40 and 41 are inclined such that the distance between the inner electrode layers 40 and 41 decreases as they approach the upper surface 2a from the lower surface 2b. The inner electrode layers 40 and 41a which are inclined and extend substantially parallel to each other, as shown in FIG. 10A, may be provided instead of the inner electrode layers 40 and 41 shown in FIG. 9A.

Figure 10B:
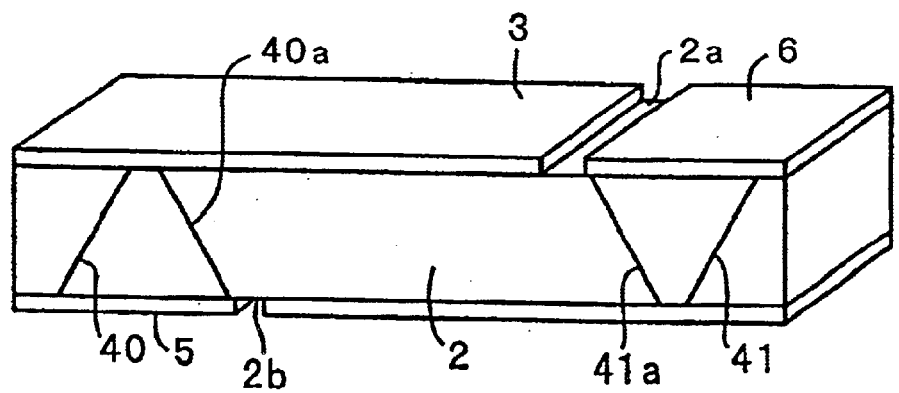
FIG. 10B is a perspective view of still another modification of the piezoelectric resonator of the first preferred embodiment of the present invention.

Moreover, the plurality of inner electrode layers 40, 40a, 41, and 41a may be arranged as shown in FIG. 10B, such that the reliability of the electrical connection between a resonance electrode and the connecting electrode provided on the main surface opposed to the resonance electrode is further improved.

Figure 11:
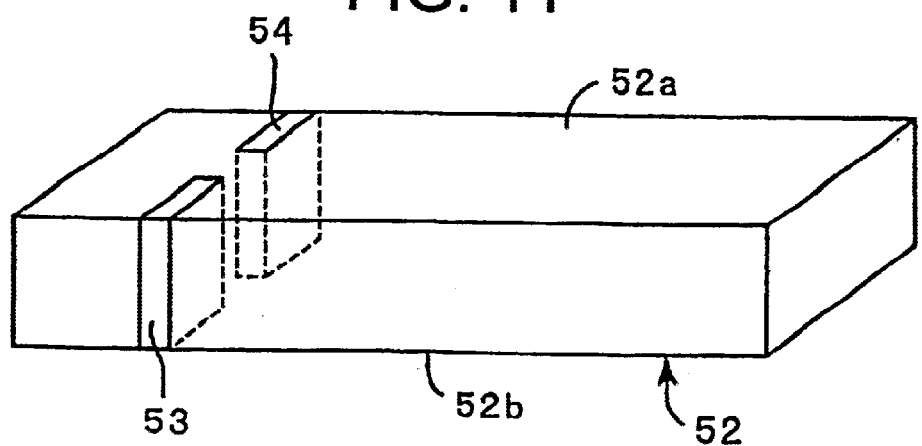
FIG. 11 is a perspective view showing the piezoelectric member of a piezoelectric resonator according to a second preferred embodiment of the present invention.

FIG. 11 is a schematic perspective view showing a piezoelectric resonator according to a second preferred embodiment of the present invention. FIG. 11 shows a piezoelectric member 52 included in the second preferred embodiment, excluding connecting electrodes and resonance electrodes. The connecting electrodes and the resonance electrodes are arranged in the same manner as those in the first preferred embodiment.

Figure 12:
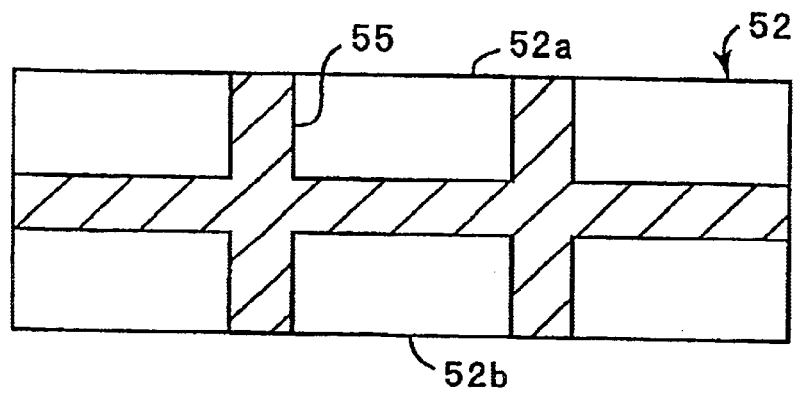
FIG. 12 is a transverse cross-sectional view of a piezoelectric member showing a modification of the inner electrode layer.

Inner electrode layers 53 and 54 are arranged to connect upper and lower surfaces 52a and 52b to each other in the piezoelectric member 52 included in the second preferred embodiment. The inner electrode layers 53 and 54 are separated and opposed to each other at the approximate center in the width direction of the piezoelectric member 52. In other words, the inner electrode layers 53 and 54 correspond to the structure of the inner electrode layer 7 that is provided in the first preferred embodiment and is divided at the approximate center in the width direction of the piezoelectric member. Thus, the inner electrode layer 7 is divided, that is, the inner electrode 7 extend does not extend across the entire cross-section in the width direction of the piezoelectric member 52, as described above, and thereby, the bonding strength of the piezoelectric ceramics at both sides of the inner electrode layers 53 and 54 is improved. In FIG. 11, the inner electrode layers 53 and 54 are opposed to each other at the approximate center in the width direction of the piezoelectric member 52 thus forming a slit between them. According to the present invention, the inner electrode layers may have different shapes such as slits, apertures, or other suitable shapes. For examples, the inner electrode layer 55 including two cross shapes combined with each other may be provided, as shown in the cross section of the piezoelectric member 52 of FIG. 12. The use of the inner electrode layer 55 of FIG. 12 further improves the bonding strength of the piezoelectric ceramic portions at both sides of the inner electrode layer 55.

Figure 13A:
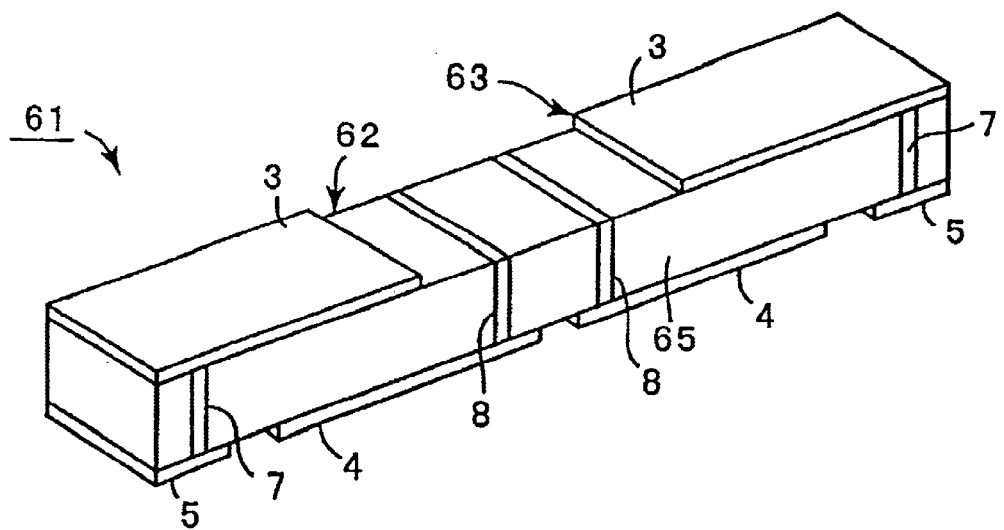
FIG. 13A is a perspective view of a piezoelectric filter according to a third preferred embodiment of the present invention.
Figure 13B:
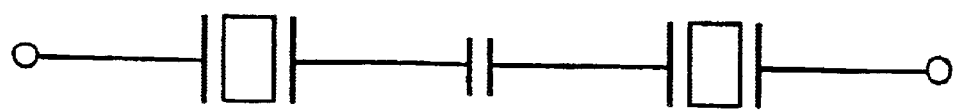
FIG. 13B is an equivalent circuit diagram of the piezoelectric filter of FIG. 13A.

FIG. 13 is a perspective view of a piezoelectric filter according to a third preferred embodiment of the present invention. FIG. 13B shows an equivalent circuit of the piezoelectric filter.

The piezoelectric filter 61 includes two piezoelectric resonance units 62 and 63 that are integrated with each other. Each of the piezoelectric resonance units 62 and 63 is preferably arranged in the same manner as the piezoelectric resonator 1 of the first preferred embodiment except that the connecting electrode on one side of the piezoelectric resonator 1 is not provided.

In particular, the piezoelectric filter 61 includes an elongated rectangular-plate shaped piezoelectric member 65, which is polarized in the longitudinal direction.

The resonance electrodes 3 and 4, the connecting electrode 5, and the inner electrode films 7 and 8 are provided on one side of the piezoelectric body 65, similarly to the first preferred embodiment. Moreover, a piezoelectric resonance unit 63 is provided on the other side of the piezoelectric member 65, similarly to the piezoelectric resonance unit 62. Thus, the piezoelectric resonance units 62 and 63 define the resonators shown in FIG. 13B. The inner electrode layer 8 of the piezoelectric resonance unit 62 and the inner electrode layer 8 of the piezoelectric resonance unit 63 are opposed to each other to define a capacitor. The filter circuit shown in FIG. 13B is provided between the connecting electrodes 5. In this case, capacitors having different electrostatic capacitances are produced by adjusting the distance between the inner electrode layers 8.

As described above, according to various preferred embodiments of the present invention, a capacitor is defined by arranging a pair of inner electrode layers to be opposed to each other.

Figure 14A:
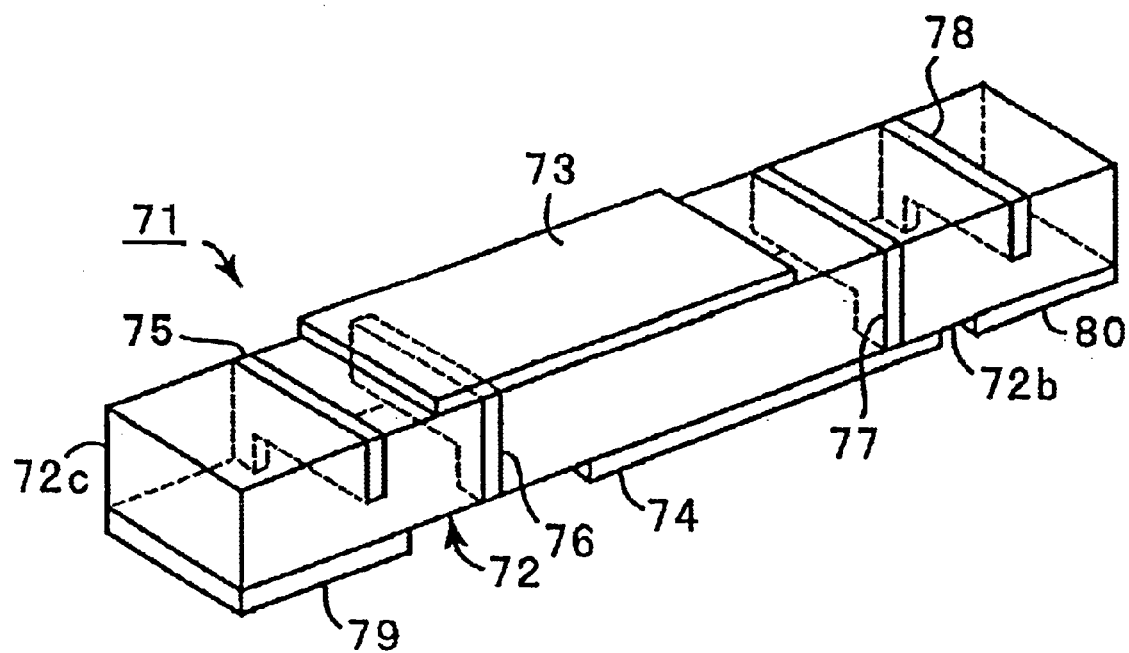
FIG. 14A is a perspective view of a piezoelectric filter according to the fourth preferred embodiment of the present invention.
Figure 14B:
FIG. 14B is an equivalent circuit diagram of the piezoelectric filter of FIG. 14A.

FIG. 14A is a perspective view of a piezoelectric filter according to a fourth preferred embodiment of the present invention. FIG. 14B is an equivalent circuit diagram of the piezoelectric filter. In a piezoelectric filter 71, resonance electrodes 73 and 74 are provided in the approximate center of a piezoelectric member 72 in the longitudinal direction thereof. The resonance electrodes 73 and 74 are provided on the front and back surfaces of the piezoelectric member 72 to be opposed to each other, and define a piezoelectric resonance unit utilizing an energy-trap type shear mode similarly to the piezoelectric resonator 1 of the first preferred embodiment.

Inner electrode layers 75 to 78 are provided in the piezoelectric member 72. The inner electrode layer 76 is electrically connected to the resonance electrode 73 on the upper surface of the piezoelectric member 72. The inner electrode layer 77 is electrically connected to the resonance electrode 74. The inner electrode layer 75 is provided on the outside of the inner electrode layer 76 via a piezoelectric layer. The inner electrode layer 78 is provided on the outside of the inner electrode layer 77 via a piezoelectric layer. Accordingly, capacitors are defined between the inner electrode layers 75 and 76 and between the inner electrode layers 77 and 78.

Moreover, connecting electrodes 79 and 80 are provided on the lower surface of the piezoelectric member 72, and are electrically connected to the inner electrode layers 75 and 78, respectively. Thus, the circuit shown in FIG. 14B is provided between the connecting electrodes 79 and 80. Thus, the piezoelectric filter 71 can be easily surface-mounted onto a printed circuit board via the lower surface 72b of the piezoelectric member 72.

The inner electrode layers 75 and 78 are both exposed at the lower surface 72b of the piezoelectric member 72 in a region of the lower surface near the side surface 72c. On the other hand, the inner electrode layers 76 and 77 are exposed at the lower surface 72b of the piezoelectric member 72 in a region of the lower surface 72b near the side surface 72d. The inner electrode layer 78 is electrically connected to the resonance electrode 74 via the exposed portion thereof.

Accordingly, the connecting electrodes 79 and 80 are provided on the lower surface 72b in a region of the lower surface 72b near the side surface 72c. As is clear from the above-description, when an inner electrode layer is electrically connected to a connecting electrode, the inner electrode layer is exposed at the lower surface 72b of the piezoelectric member 72 in a region near one side surface thereof such that the inner electrode layer is prevented from short-circuiting with the other inner electrode layer or another electrode, similarly to the inner electrode layers 75 and 78.

The electronic component in accordance with various preferred embodiments of the present invention includes the flat plate-shaped inner electrode layer which is exposed at the upper surface of the member of the electronic component at a predetermined region in the width direction to be electrically connected to the first electrode provided on the upper surface of the member of the electronic component, extends from the upper surface of the member of the electronic component toward the lower surface thereof, and is exposed at the lower surface at a desired region in the width direction. Thus, the inner electrode layer is electrically connected to the connecting electrode provided on the lower surface of the member of the electronic component. Accordingly, the member of the electronic component can be easily surface-mounted onto a board via the lower surface of the member of the electronic component. Moreover, since the first electrode on the upper surface and the connecting electrode on the lower surface are electrically connected to each other via the inner electrode layer, the reliability of the electrical connection is greatly improved. The electrical connection is prevented from being damaged when the electronic component is handled and processed.

In addition, the position at which the inner electrode film is provided and the size in the longitudinal direction of the member of the electronic component is easily adjusted. Thus, an electronic component having a required size and desired excellent characteristics is easily provided.

In the case in which the second inner electrode layer is arranged to be opposed to the inner electrode layer with a layer of the electronic component therebetween, the inner electrode layer and the second inner electrode layer define a capacitor.

The inner electrode layer may be extended in the direction that is substantially perpendicular to the upper surface of the member of the electronic component or may be arranged so as to intersect the upper surface at an angle of less than about 90°.

The piezoelectric resonator of various preferred embodiments of the present invention, which has the structure of an energy-trap type piezoelectric resonator, includes the flat plate-shaped inner electrode layer which extends from the upper surface toward the lower surface, the inner electrode layer is exposed at the upper surface at a predetermined region in the width direction of the piezoelectric member, the inner electrode layer is exposed at the lower surface at a desired region in the width direction of the piezoelectric member, and the inner electrode layer being electrically connected to the first or second resonance electrode, and the connecting electrode provided on the upper or lower surface of the piezoelectric member and electrically connected to the inner electrode layer. Accordingly, the piezoelectric resonator can easily be surface-mounted via the surface having the connecting electrode provided thereon. Moreover, the electrical connection between the connecting electrode and the resonance electrode is reliably achieved by the inner electrode layer. Thus, the reliability of the electrical connection between the resonance electrode and the connecting electrode is greatly improved.

Moreover, the position of the inner electrode layer and the size in the longitudinal direction of the piezoelectric member is easily adjusted. Therefore, spurious responses, which are due to the length of the piezoelectric member, are easily minimized and eliminated. This produces a piezoelectric resonator having a greatly reduced size.

In the case in which the inner electrode layer includes the first inner electrode layer connected to the first resonance electrode, and the second inner electrode layer electrically connected to the second resonance electrode, the connecting electrodes are provided on both the upper and lower surfaces of the piezoelectric member. Thus, the piezoelectric resonator can be surface-mounted via the upper surface or the lower surface of the piezoelectric member.

The inner electrode film may be exposed over the entire width of each of the upper and lower surfaces of the piezoelectric member, or may be exposed over only a portion of the width thereof.

The inner electrode film may be extended in the direction that is substantially perpendicular to the upper and lower surfaces, or may be arranged to cross the upper surface of the piezoelectric member at an angle of less than about 90°. The shape and size of the inner electrode layer and the direction in which the inner electrode layer intersects the upper surface are suitably selected according to the size of the piezoelectric member and the position of the connecting electrode.

In the case in which the charge-taking-out inner electrode layer which is opposed to the inner electrode layer via a piezoelectric layer to define a capacitor and which takes out the electric charge from the capacitor is provided, a capacitor is easily be provided in the piezoelectric resonator.

In the case in which the inner electrode layer includes at least one slit or aperture, the piezoelectric layers at both sides of the inner electrode layer are strongly bonded to each other via the slit or aperture. Thus, the mechanical strength is greatly increased.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An electronic component comprising:
    a piezoelectric member having upper and lower surfaces opposed to each other, a pair of side surfaces opposed to each other, and a pair of end surfaces opposed to each other, the pair of side surfaces extending in the longitudinal direction of the piezoelectric member and being opposed to each other in the width direction of the piezoelectric member;
    a first electrode provided on the upper surface of the piezoelectric member of the electronic component;
    a flat plate-shaped first inner electrode layer exposed at the upper surface of the piezoelectric member of the electronic component at a desired region in the width direction so as to be electrically connected to the first electrode, said first inner electrode layer being spaced inwardly from said pair of end surfaces, said first inner electrode layer extending from the upper surface to the lower surface, and said first inner electrode layer being exposed at the lower surface at a desired region in the width direction; and
    a connecting electrode provided on the lower surface of the piezoelectric member of the electronic component and electrically connected to the first inner electrode layer; wherein
        said first inner electrode layer is spaced inwardly from said pair of end surfaces such that piezoelectric material of the piezoelectric member is interposed between the first inner electrode layer and said pair of end surfaces.

2. An electronic component according to claim 1, further comprising a second inner electrode layer arranged to be opposed to the first inner electrode layer via a layer of the piezoelectric member of the electronic component.

3. An electronic component according to claim 1, wherein the first inner electrode layer extends in a direction that is substantially perpendicular to the upper surface of the piezoelectric member of the electronic component.

4. An electronic component according to claim 2, wherein at least one of the first inner electrode layer and the second inner electrode layer extends in a direction that is substantially perpendicular to the upper surface of the piezoelectric member of the electronic component.

5. An electronic component according to claim 1, wherein the first inner electrode layer is arranged to intersect the upper surface of the member at an angle of less than about 90°.

6. An electronic component according to claim 2, wherein at least one of the first inner electrode layer and the second inner electrode layer is arranged to intersect the upper surface of the piezoelectric member at an angle of less than about 90°.

7. An electronic component according to claim 1, wherein said piezoelectric member has an elongated rectangular plate-shape.

8. An electronic component according to claim 1, wherein at least one of the upper surface and the lower surface of said piezoelectric member includes a beveled portion.

9. An electronic component according to claim 1, wherein said connecting electrode extends from one of said pair of end surfaces towards the other of said pair of end surfaces.

10. An electronic component according to claim 1, wherein said piezoelectric member is polarized in the direction extending from one of said pair of end surfaces to the other of said pair of end surfaces.

11. An energy trap type piezoelectric resonator, comprising:
    a piezoelectric member having an upper surface, a lower surface, a pair of side surfaces opposed to each other, and a pair of first and second end surfaces opposed to each other, the pair of side surfaces extending in the longitudinal direction of the piezoelectric member and being opposed to each other in the width direction of the piezoelectric member;
    first and second resonance electrodes provided on the upper and lower surfaces of the piezoelectric member, respectively, the first resonance electrode extending from an edge defined by the first end surface and the upper surface toward the second end surface, the second resonance electrode extending from an edge defined by the second end surface and the lower surface toward the first end surface, the first and second resonance electrodes being arranged to overlap each other at an approximate center of the piezoelectric member in the longitudinal direction;
    a flat plate-shaped first inner electrode layer exposed at the upper surface at a desired region in the width direction of the piezoelectric member, said first inner electrode layer being spaced inwardly from said pair of end surfaces, said first inner electrode layer extending from the upper surface toward the lower surface, said first inner electrode layer being exposed at the lower surface at a desired region in the width direction of the piezoelectric member, and said first inner electrode layer being electrically connected to the first or second resonance electrode; and
    a connecting electrode provided on the upper or lower surface of the piezoelectric member and electrically connected to the inner electrode layer; wherein
        said first inner electrode layer is spaced inwardly from said pair of first and second end surfaces such that piezoelectric material of the piezoelectric member is interposed between the first inner electrode layer and said pair of first and second end surfaces.

12. A piezoelectric resonator according to claim 11, further comprising a second inner electrode layer electrically connected to the second resonance electrode.

13. A piezoelectric resonator according to claim 11, wherein the first inner electrode layer is exposed at each of the upper and lower surfaces of the piezoelectric member over the entire width thereof.

14. A piezoelectric resonator according to claim 11, wherein the first inner electrode layer is exposed at the lower surface of the piezoelectric member over a portion of the width thereof.

15. A piezoelectric resonator according to claim 11, wherein the first inner electrode layer extends in a direction that is substantially perpendicular to the upper and lower surfaces of the piezoelectric member.

16. An electronic component according to claim 12, wherein at least one of the first inner electrode layer and the second inner electrode layer extends in a direction that is substantially perpendicular to the upper and lower surfaces of the piezoelectric member.

17. A piezoelectric resonator according to claim 11, wherein the fist inner electrode layer is arranged to intersect the upper surface of the piezoelectric member at an angle of less than about 90°.

18. An electronic component according to claim 12, wherein at least one of the first inner electrode layer and the second inner electrode layer is arranged to intersect the upper surface of the piezoelectric member at an angle of less than about 90°.

19. A piezoelectric resonator according to claim 11, wherein charge-taking-out first and second inner electrode films defining a capacitor and taking out the charge from the capacitor are arranged so as to be opposed to each other via a layer of the piezoelectric member.

20. A piezoelectric resonator according to claim 11, wherein the piezoelectric member is polarized in a direction extending from one of said first and second end surfaces to the other of said first and second end surfaces.

* * * * *